United States Patent
Boniardi et al.

(10) Patent No.: US 11,417,398 B2
(45) Date of Patent: Aug. 16, 2022

(54) MEMORY CELLS FOR STORING OPERATIONAL DATA

(71) Applicant: Micron Technology, Inc., Boise, ID (US)

(72) Inventors: Mattia Boniardi, Cormano (IT); Anna Maria Conti, Milan (IT); Innocenzo Tortorelli, Cernusco Sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 50 days.

(21) Appl. No.: 17/108,783

(22) Filed: Dec. 1, 2020

(65) Prior Publication Data

US 2022/0172782 A1    Jun. 2, 2022

(51) Int. Cl.
| | | |
|---|---|---|
| *G11C 7/00* | (2006.01) | |
| *G11C 16/10* | (2006.01) | |
| *G11C 16/34* | (2006.01) | |
| *G11C 16/30* | (2006.01) | |
| *G11C 16/26* | (2006.01) | |

(52) U.S. Cl.
CPC .............. *G11C 16/10* (2013.01); *G11C 16/26* (2013.01); *G11C 16/30* (2013.01); *G11C 16/3404* (2013.01)

(58) Field of Classification Search
CPC ...... G11C 16/10; G11C 11/5628; G11C 16/12; G11C 16/0483
USPC .......................... 365/189.15, 189.16, 185.19
See application file for complete search history.

(56) References Cited

U.S. PATENT DOCUMENTS

2019/0333588 A1* 10/2019 Yang ...................... G11C 16/26
2020/0075076 A1* 3/2020 Lee ......................... G11C 7/065

* cited by examiner

*Primary Examiner* — Son T Dinh
(74) *Attorney, Agent, or Firm* — Holland & Hart LLP

(57) ABSTRACT

Methods, systems, and devices for memory cells for storing operational data are described. A memory device may include an array of memory cells with different sets of cells for storing data. A first set of memory cells may store data for operating the memory device, and the associated memory cells may each contain a chalcogenide storage element. A second set of memory cells may store host data. Some memory cells included in the first set may be programmed to store a first logic state and other memory cells in the first set may be left unprogrammed (and may represent a second logic state). Sense circuitry may be coupled with the array and may determine a value of data stored by the first set of memory cells.

25 Claims, 7 Drawing Sheets

MEMORY CELLS FOR STORING OPERATIONAL DATA

FIELD OF TECHNOLOGY

The following relates generally to one or more systems for memory and more specifically to memory cells for storing operational data.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
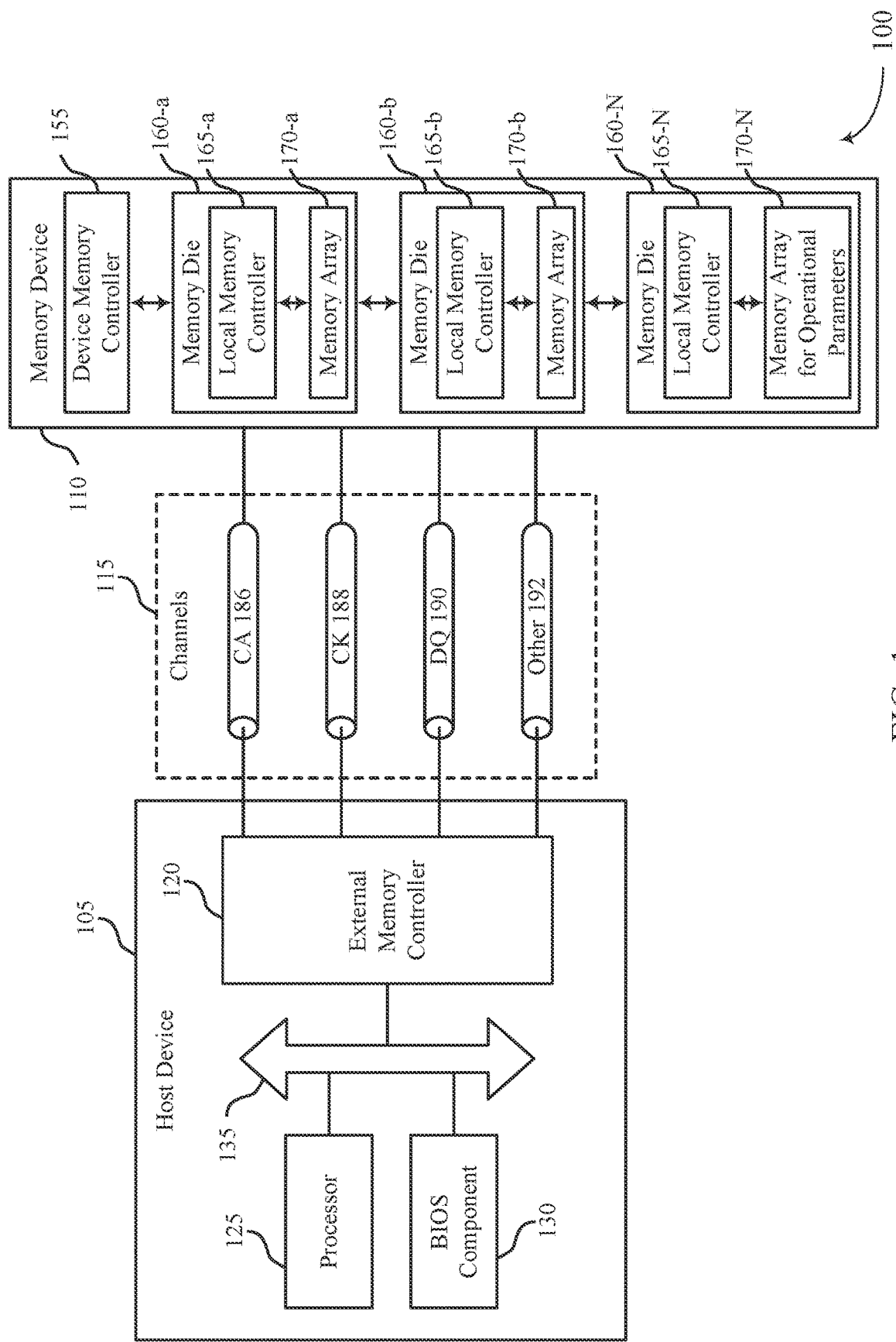
FIG. 1 illustrates an example of a system that supports memory cells for storing operational data in accordance with examples as disclosed herein.

Memory devices may employ a number of different techniques to store data. In some cases, a memory device may store data permanently at the device so that the data may not be overwritten or lost, even in cases where the device loses power. Such data may be examples of information that is used by the memory device to operate the memory device (such as trim parameters or other information used to operate the memory device). In some cases, such data may be stored by an array of fuses to ensure that the data is not lost. An array of fuses may be example of a read-only-memory (ROM) or programmable read-only memory (PROM), and may be useful in cases where unalterable data or instructions are stored in memory. In some cases, programming a ROM or a PROM may include "blowing" certain fuses or anti-fuses. Combinations of blown fuses and unblown fuses may represent a certain state of fuse data (e.g., either a "1" or "0" binary state). In some implementations, the array of fuses may be integrated as dedicated structures or circuitry located at the periphery of a memory device or array, or as a fuse array separate from the greater portion of the memory device or array.

This kind of fuse architecture and writing process, however, may have a number of drawbacks. For example, the portion of the memory device used for the fuses and drivers may occupy a significant amount of area, and the drivers (e.g., MOSFET transistors, bipolar transistors, etc.) used to blow fuses may use relatively high programming current, increasing the overall power consumption of the memory device. Moreover, the fuses may be programmed before the associated memory array is soldered to a memory chip. The soldering process may expose the memory array to relatively high temperatures for a prolonged duration, which may affect the data stored to the fuses.

Instead of a dedicated array of fuses or anti-fuses at the periphery of the memory array, a memory array may be configured within the memory device to store data used for operating the associated memory device. In some cases, the array storing the fuse may be a subarray or portion of memory cells contained within the memory device. In some cases, the array storing the data may be separate from the portions of the memory array storing other types of data, such as user data. In either case, the memory cells included in the array that are used to store the operational data may each include a chalcogenide storage element. Some of the memory cells may be programmed a single time (e.g., the memory cells may be "first fired" memory cells) and may store a first logic state, while other memory cells may be left unprogrammed (e.g., the memory cells may not have been programmed to store a first logic state) and may store a second logic state. Programming some cells a single time and leaving other cells unprogrammed may widen the read margin between the different states of the cells. With a wider read margin (e.g., electrical distance between the threshold voltages of the respective logic states), data corruption and loss that may otherwise be incurred during a soldering operation may be reduced. For example, heating of the memory device during soldering may cause the threshold voltages of the various memory cells to shift or drift, but the distance between the threshold voltages of the two states, when unprogrammed memory cells are used, may be configured to reduce errors that may occur due to this shifting or drifting. Additionally, because the cells of the array for storing the data are different than fuses, the current used to program the cells may be reduced and thereby the quantity of current drivers may be reduced and/or the size of current drivers may be reduced among other possible benefits.

Features of the disclosure are initially described in the context of a system and a memory array as described with reference to FIGS. 1 and 2. Features of the disclosure are described in the context of a block diagram and flowcharts as described with reference to FIGS. 3-5B. These and other features of the disclosure are further illustrated by and described with reference to an apparatus diagram and a flowchart that relate to memory cells for storing operational data as described with references to FIGS. 6 and 7.

FIG. 1 illustrates an example of a system 100 that supports memory cells for storing operational data in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the memory device 110 may include a memory array for storing operational parameters 170-N. The memory array 170-N may store data relating to parameters such as redundancy information (e.g., information indicative of defective components within the memory device) and trimming information (e.g., information regarding device specific adjustments to internal characteristics and operating parameters of the memory device), among other information. Accordingly, the device memory controller 155 or the local memory controller 165-N may read data stored to the memory array 170-N and the memory device 110 may be operated based on the stored data.

The memory array 170-N may be an example of a dedicated memory array (e.g., as shown in FIG. 1) or may be a portion of another memory array of the memory device 110. For example, operational data may be stored to either the memory array 170-a or memory array 170-b (or another memory array of the memory device 110). The memory array 170-N (or the portion of another memory array that is configured to store operational data) may include memory cells that have a chalcogenide storage element. The chalcogenide storage element may be configured to store a first logic state (e.g., based on a programming pulse being applied during a fabrication process) or a second logic state (e.g., based on the memory cell being left unprogrammed when the operational parameters are stored in the memory array 170-N). While the memory cells of the memory array 170-N (or the portion of another memory array that is configured to store operational data) may include a chalcogenide storage element, the memory device 110 may include other types of memory cells for storing host data (such as DRAM cells, FeRAM cells, and the like).

In some examples, the memory device 110 may include sense circuitry coupled with the memory array 170-N (or the portion of another memory array that is configured to store operational data). The sense circuitry may be configured to receive a number of signals indicating the values of data stored in the memory array 170-N or cells configured to store operational data. Due to the techniques for programming memory cells, as described herein, the sense circuitry may be able to accurately sense memory cells of the memory array 170-N (or memory cells configured to store operational data). That is, the techniques described herein may prevent data corruption and loss that may otherwise be incurred during fabrication. Additionally, because operational data may be stored to the memory array 170-N (e.g., as opposed to an array of fuses or anti-fuses located on the periphery of the memory device 110), the quantity of current drivers may be reduced and/or the size of current drivers of the memory device 110 may be reduced among other possible benefits.

Figure 2:
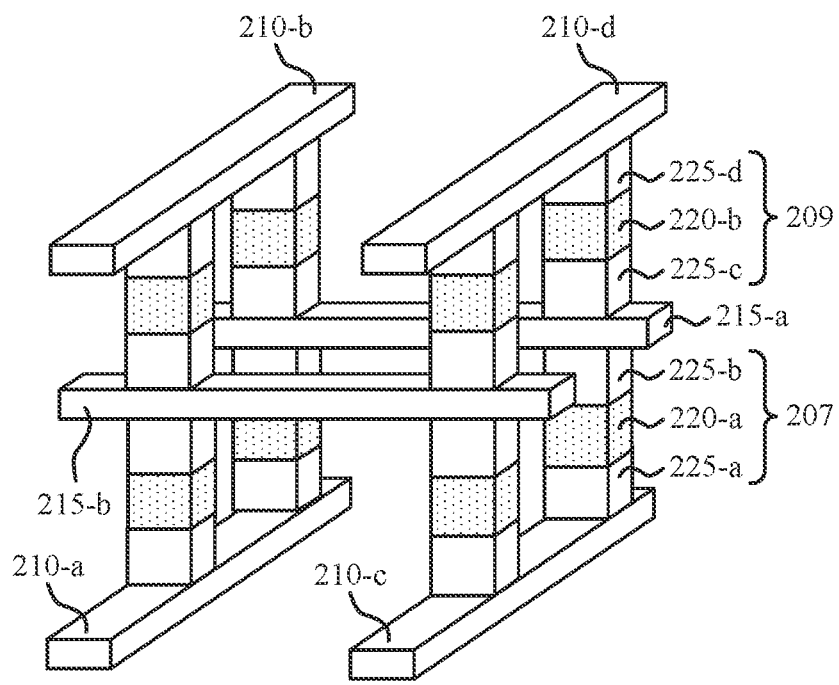
FIG. 2 illustrates an example of a memory array that supports memory cells for storing operational data in accordance with examples as disclosed herein.

FIG. 2 illustrates an example of a memory array 200 in accordance with examples as disclosed herein. Memory array 200 may be an example of portions of the memory arrays or memory dies described with reference to FIG. 1. The memory array 200 may include a first deck 207 of memory cells that is positioned above a substrate (not shown) and a second deck 209 of memory cells on top of the first array or deck 207. Though the example of memory array 200 includes two decks 207, 209, the memory array 200 may include any quantity of decks (e.g., one or more than two).

Memory array 200 may also include a row line 210-a, a row line 210-b, a row line 210-c, a row line 210-d, a column line 215-a, and a column line 215-b, which may be examples of row lines 210 and column lines 215, as described with reference to FIG. 1. One or more memory cells of the first deck 207 and the second deck 209 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. In other examples, a single stack between access lines may include a chalcogenide material, such as a self-selecting chalcogenide material (e.g., a self-selecting memory cell). Although some elements included in FIG. 2 are labeled with a numeric indicator, other corresponding elements are not labeled, although they are the same or would be understood to be similar, in an effort to increase visibility and clarity of the depicted features.

One or more memory cells of the first deck 207 may include one or more of an electrode 225-a, a storage element 220-a, or an electrode 225-b. One or more memory cells of the second deck 209 may include an electrode 225-c, a storage element 220-b, and an electrode 225-d. The storage elements 220 may be examples of a chalcogenide material, such as a phase change storage element, a thresholding storage element, or a self-selecting storage element. The memory cells of the first deck 207 and second deck 209 may, in some examples, have common conductive lines such that corresponding memory cells of one or more decks 207 and one or more decks 209 may share column lines 215 or row lines 210. For example, the first electrode 225-c of the second deck 209 and the second electrode 225-b of the first deck 207 may be coupled with column line 215-a such that the column line 215-a may be shared by vertically adjacent memory cells.

In some examples, the material of the storage element 220 may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (CO, or fluorine (F), each in atomic or molecular forms.

In some examples, the storage element 220 may be an example of a phase change memory cell. In such examples, the material used in the storage element 220 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration). In some cases, a portion of a storage element may undergo a material change associated with the logic states.

In some examples, such as for thresholding memory cells or self-selecting memory cells, some or all of the set of logic states supported by the memory cells may be associated with an amorphous state of the chalcogenide material (e.g., the material in a single state may be operable to store different logic states). In some examples, the storage element 220 may be an example of a self-selecting memory cell. In such examples, the material used in the storage element 220 may be based on an alloy (such as the alloys listed above) and may be operated so as to undergo a change to different physical state during normal operation of the memory cell. For example, a self-selecting memory cell may have a high threshold voltage state and a low threshold voltage state. An low threshold voltage state may correspond to a first logic state (e.g., a SET state) and a high threshold voltage state may correspond to a second logic state (e.g., a RESET state).

During a programming (write) operation of a self-selecting memory cell (e.g., including electrode 225-a, storage element 220-a, and electrode 225-b), a polarity used for a write operation may influence (determine, set, program) a particular behavior or characteristic of the material of the storage element 220, such as the threshold voltage of the material. The difference in threshold voltages of the material of the storage element 220 depending on the logic state stored by the material of the storage element 220 (e.g., the difference between the threshold voltage when the material is storing a logic state '0' versus a logic state '1') may correspond to the read window of the storage element 220.

The architecture of memory array 200 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 2 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 2 may be electrically coupled with one another as shown or described but rearranged physically (e.g., a storage element 220 and possibly a selection element or electrode 225 may be electrically in series between a row line 210 and a column line 215 but need not be in a pillar or stack configuration).

In some examples, the memory array 200 may be an example of a memory array for storing operational parameters for a memory device (e.g., a memory device 110 as described with reference to FIG. 1). The memory array 200 may store data relating to parameters such as redundancy information (e.g., information indicative of defective components within the memory device) and trimming information (e.g., information regarding device specific adjustments to internal characteristics and operating parameters of the memory device), among other information. The operational data may be stored at, for example, the storage element 220-a, the storage element 220-b, or both.

The storage element 220-a and the storage element 220-b may each include a chalcogenide storage element configured to store a first logic state (e.g., based on a programming pulse being applied during a fabrication process) or a second logic state (e.g., based on the memory cell being left unprogrammed during a fabrication process). While the storage elements may each include a chalcogenide storage element, other memory cells of an associated memory device (not shown) may include other types of memory cells for storing host data (such as DRAM cells, FeRAM cells, and the like).

In some examples, the memory array 200 may be coupled with sense circuitry configured to receive signaling indicating the values of data stored to the storage element 220-*a* and the storage element 220-*b*. Due to the techniques described herein for programming memory cells, such as the storage element 220-*a* and the storage element 220-*b*, the sense circuitry may be able to accurately sense the memory cells of the memory array 200. That is, the techniques described herein may prevent data corruption and loss that may otherwise be incurred during fabrication. Additionally, because operational data may be stored to the memory array 200 (e.g., as opposed to a fuse bank located on the periphery of an associated memory device), the quantity of current drivers may be reduced and/or the size of current drivers of the memory system may be reduced among other possible benefits.

Figure 3:
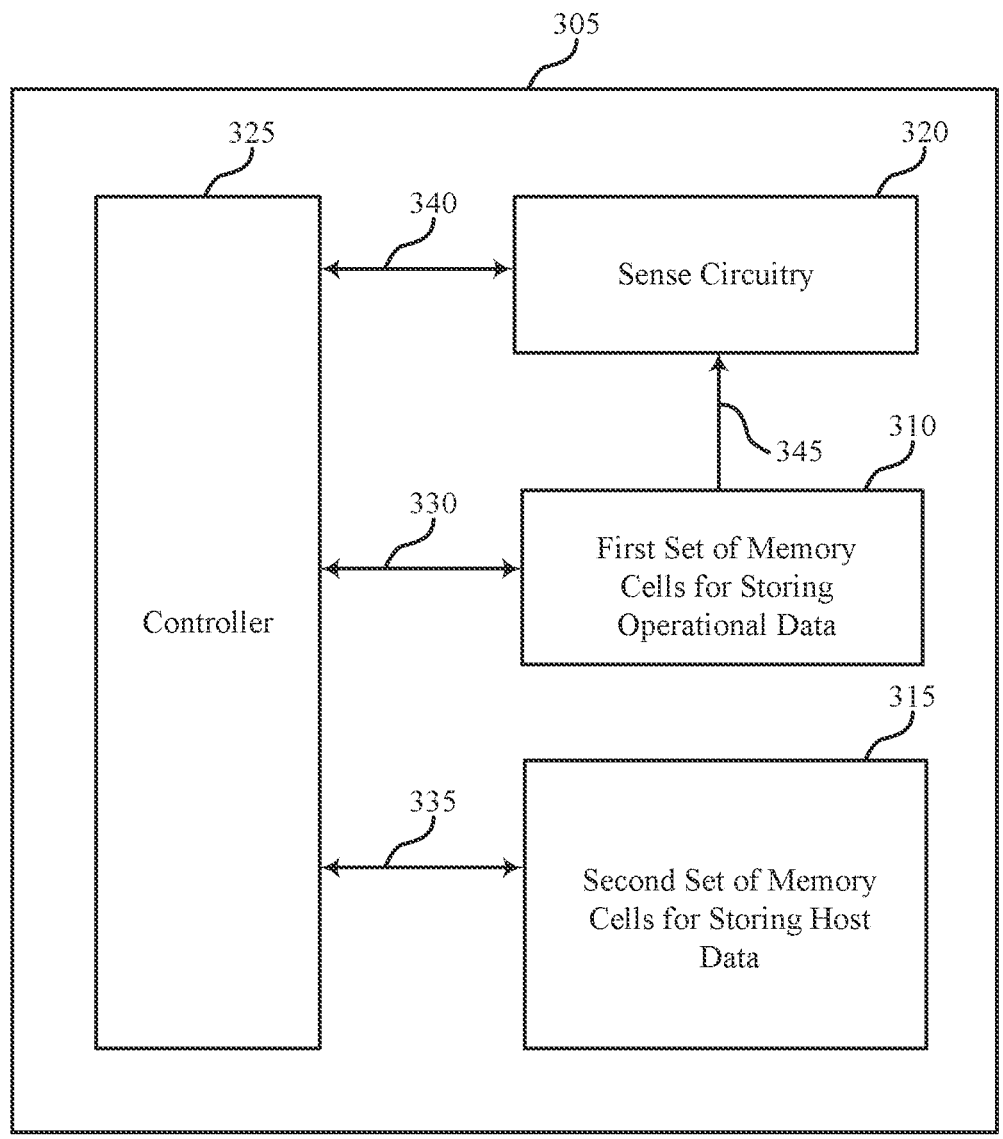
FIG. 3 illustrates an example of a block diagram that supports memory cells for storing operational data in accordance with examples as disclosed herein.

FIG. 3 illustrates an example of a block diagram 300 that supports memory cells for storing operational data in accordance with examples as disclosed herein. A memory device 305 may include a first set of memory cells 310 for storing operational data, a second set of memory cells 315 for storing host data, and sense circuitry 320. The first set of memory cells 310 for storing operational data, the second set of memory cells 315 for storing host data, and the sense circuitry 320 may each be coupled with the controller 325 using one or more communication lines 330, 335, and 340, respectively. In addition, the first set of memory cells 310 for storing operational data may be coupled with the sense circuitry 320 using communication line 345.

The first set of memory cells 310 for storing operational data may be an example of one or more memory cells located in the memory array for storing operational parameters 170-N as described with reference to FIG. 1. Moreover, the second set of memory cells 315 for storing host data may be an example of one or more memory cells located in a memory array such as memory array 170-*a* or memory array 170-*b* as described with reference to FIG. 1. The first set of memory cells 310 for storing operational data and the second set of memory cells 315 for storing host data may include a quantity of memory cells. The first set of memory cells 310 for storing operational data may be configured to store information used to operate the memory device. The operational data, in some cases, may include data relating to redundancy information (e.g., information indicative of defective components within the memory device) and trimming information (e.g., information about voltage levels, information regarding device specific adjustments to internal characteristics and operating parameters of the memory device, or other information), among other information. In some cases, the first set of memory cells 310 for storing operational data may include memory cells containing chalcogenide. Additionally, the first set of memory cells 310 for storing operational data may occupy a smaller area on the memory device 305 as compared to the second set of memory cells 315 for storing host data.

In some cases, a set of memory cells (e.g., the first set of memory cells 310) may be configured within the memory device 305 to store data relating to operating the memory device 305 instead of the memory device 305 having a dedicated array fuses or anti-fuses at the periphery of the memory device 305. Storing the operational parameters (e.g., fuse data) in the first set of memory cells 310 may have a number of benefits as compared to other systems, devices, and techniques, which may store fuse data in fuses or fuse-like structures (e.g., various poly-silicon resistors or other metallic resistive components) that are "blown" by driving a threshold amount of current through the fuse link.

For example, instead of irreversibly "blowing" fuses or anti-fuses using a comparatively large driver component (e.g., a MOSFET transistor, a bipolar transistor, and the link), the first set of memory cells 310 may contain memory cells containing a chalcogenide element, which may be reprogrammable. In addition, because the current used to program a memory cell may be less than the current used to blow a fuse or anti-fuse, the quantity and/or the size of current drivers present at the memory device 305 may be reduced.

In addition, the first set of memory cells 310 may use less area on the memory device 305 as compared to a separate quantity of fuses located in the memory device. For example, the first set of memory cells may correspond to a subset of a memory array (e.g., a subset of a memory array that also stores host data). Additionally or alternatively, the first set of memory cells may be included in a dedicated array for storing data related to operating the memory device 305. Further, the first set of memory cells 310 for storing operational data may be better integrated with other components located in more central portions of the memory device 305, such as additional sense circuitry 320, a controller 325, and a second set of memory cells 315 for storing host data.

As described herein, the first set of memory cells 310 may store data relating to operating the memory device 305. For example, the memory device 305 may operate according to data stored to individual memory cells of the first set 310, data stored to a portion of the first set of memory cells 310 (e.g., data stored to a subset of the first set of memory cells 310), or based on a pattern of data stored to the first set of memory cells 310. The data stored to the first set of memory cells 310 may be based on the logic state of one or more memory cells. For example, some memory cells may store a first logic state (e.g., a logic "1"), while other memory cells of the first set 310 may store a second logic state (e.g., a logic "0").

Memory cells included in the first set of memory cells 310 may each include a chalcogenide storage element. In some examples, a programming pulse may be applied to some memory cells of the first set 310, which may affect (e.g., alter) the voltage distribution of the respective memory cells, and may result in the respective memory cells storing a first logic state. Additionally or alternatively, some memory cells of the first set 310 may be left in an unprogrammed state (e.g., a programming pulse may not be applied to the memory cells), which may not affect (e.g., not alter) the voltage distribution of the respective memory cells, and may result in the respective memory cells storing a second logic state.

In some examples, the memory cells of the first set 310 that store a first logic state may be referred to as "first fired" memory cells. A first fired memory cell may refer to a memory cell that is programmed at least one time. For example, after fabrication, memory cells may have a threshold voltage that is different than a threshold voltage associated with a first logic state (e.g., '1') or a second logic state (e.g., '0'). Once the memory cell is programmed (e.g., first fired), the memory cell may not regain the threshold voltage that existed before being programmed. In some cases, during a fabrication process, the first set of memory cells 310 may be manufactured and programmed to an initial logic state by applying a programming pulse (e.g., the memory cells 310 may be programmed for a first time and thus may store a first logic state). In some examples, a probe or other manufacturing tool may apply the programming pulse to some of the memory cells of the first set 310, resulting in the respective memory cells storing the first logic state.

Additionally or alternatively, the memory cells of the first set 310 that store a second logic state may be unprogrammed memory cells. An unprogrammed memory cell may refer to a memory cell that is not or never programmed using a programming pulse (e.g., a virgin memory cell). For example, during the fabrication process, a programming pulse may be applied to some memory cells of the first set 310, resulting in the memory cells being programmed (e.g., and thus storing a first logic state). A probe or other manufacturing tool may refrain from applying the programming pulse to other memory cells, resulting in the memory cells being left unprogrammed (e.g., and thus storing a second logic state). The voltage distribution of the first fired memory cells and the unprogrammed memory cells may differ such that, after other manufacturing processes (e.g., heating during a soldering process), the sense circuitry 320 may be able to differentiate memory cells storing a first logic state and a second logic state. As described herein, the memory device 305 may be operated according to data stored to the first set of memory cells 310.

In some examples, during a fabrication process, the probe or other manufacturing tool may solder the first set of memory cells 310 to the memory device 305. The soldering process may expose the first set of memory cells 310 to a relatively high temperature (e.g., 250 C) for a relatively long duration (e.g., 30 minutes). In some examples, the probe or other manufacturing device may solder the second set of memory cells 315 to the memory device 305, thus expositing the second set of memory cells 320 to the relatively high temperature for the duration. The soldering process thus may result in some memory cells of the first set 310 (or the second set 320) experiencing a voltage drift. For example, the threshold voltage of some memory cells of the first set 310 that store a first logic state may shift or drift toward a threshold voltage associated with the second logic state. The probe or other manufacturing tool may apply (e.g., re-apply) the programming pulse to these memory cells in order to program (e.g., reprogram) the first logic state to the respective memory cells. Accordingly, the sense circuitry 320 may be able to differentiate memory cells storing a first logic state and a second logic state in order for the memory device to be properly operated according to data stored to the first set of memory cells 310.

In some cases, the first set of memory cells 310 for storing operational data may be located in various locations in the memory device 305. For example, as previously described, the first set of memory cells 310 for storing operational data may be a sub-array located within the greater portion of the memory device 305, and may be integrated with other components, such as the second set of memory cells 315 for storing host data. In other examples, the first set of memory cells 310 may be separate from the greater portion of the memory array (e.g., separate from the portion of the array storing host data). In either or both cases, the first set of memory cells 310 may store information for operating the memory device 305, which may be represented by certain binary states stored by the first set of memory cells 310.

The second set of memory cells 315 for storing host data may be configured to store host data, which may include a codeword, page, or other value received from a host device (e.g., a personal computer). Host data may typically include data generated by the user logic which is stored and retrieved in memory that could otherwise be used for different data types. For example, a host device that includes a processor may cause information to be stored in the second set of memory cells 315 for any process or application being performed by the processor. The second set of memory cells 315 may in some cases include memory cells containing chalcogenide. In other cases, the second set of memory cells 315 may contain other types of memory cells, such as DRAM cells, FeRAM cells, non-volatile memory cells (e.g., not-and (NAND) flash memory cells), or other types of memory cells.

The sense circuitry 320 may include other circuit elements configured to perform functions of the memory device 305. In some cases, the sense circuitry 320 may be coupled with the first set of memory cells 310 for storing operational data. The sense circuitry 320 may be configured to receive a number of signals indicating the values of data stored in the first set of memory cells 310. The second set of memory cells 315 may in some cases be coupled with sense circuitry 320, or may in some other cases be coupled with a different set of sense circuitry.

In some examples, the first set of memory cells 310 for storing operational data may use a single memory cell or a set of memory cells that may be programmed in the same state (e.g., a "1" or a "0") to store a single value of data. One or more operational parameters of the memory device 305 may be set (e.g., determined) based on data stored to one memory cell, a subset of the first set of memory cells 310, or may be based on a pattern of the data programmed to the first set of memory cells 310. In such examples, a read operation may include signaling to determine the value of data stored in the memory cells, and operational parameters of the memory device 305 may be set accordingly.

In some examples, the sense circuitry 320 may employ signaling techniques to determine the value of operational parameters stored in the first set of memory cells 310. For example, sense circuitry 320 may receive a signal over the communication line 345 from the first set of memory cells 310, and may compare the signal received over the communication line 345 to a given fixed reference potential or reference signal. The sense circuitry 320 may send to the controller 325, an output signal indicating the value of the data stored in the first set of memory cells 310 based on comparing the signal received over the communication line 345 to the given fixed reference potential.

The first set of memory cells 310 for storing operational data, the second set of memory cells 315 for storing host data, and sense circuitry 320 may output a number of signals to controller 325. The controller 325 may be an example of the memory controller 140 as described with reference to FIG. 1. In some cases, the memory controller may be configured to access the second set of memory cells 315 for storing host data based on the data stored in the first set of memory cells 310.

Figure 4:
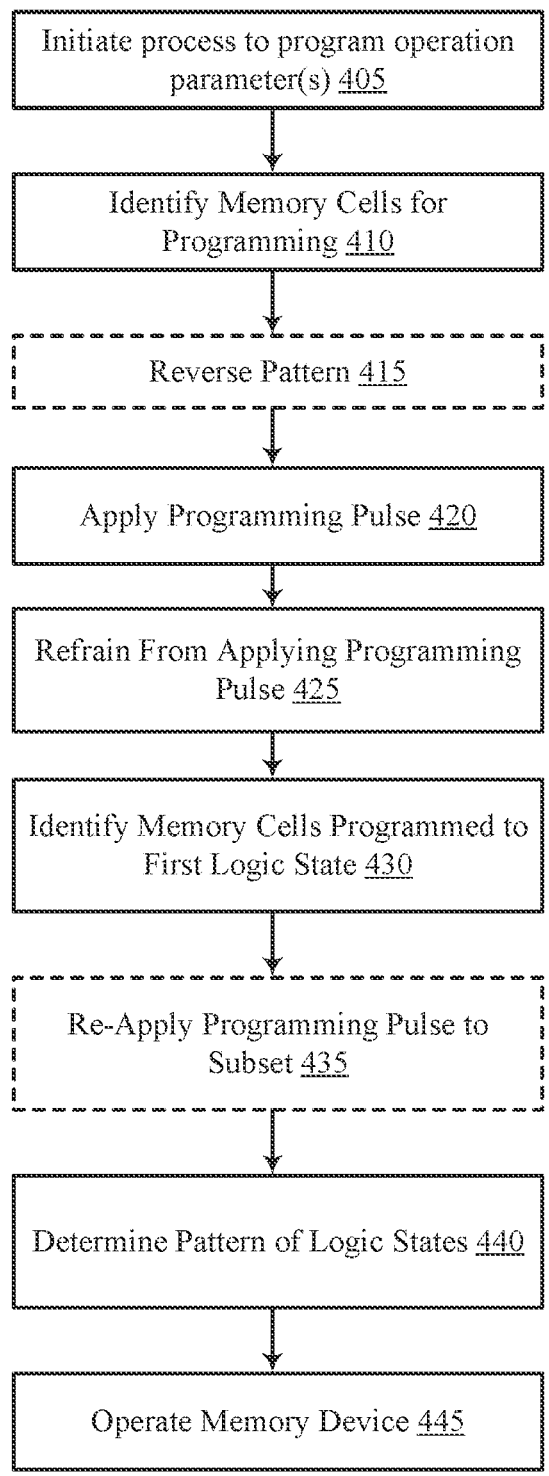
FIG. 4 illustrates an example of a flowchart that supports memory cells for storing operational data in accordance with examples as disclosed herein.

FIG. 4 illustrates an example of a flowchart 400 that supports memory cells for storing operational data in accordance with examples as disclosed herein. In some examples, the flowchart 400 may illustrate programming one or more memory cells for storing operational data associated with a memory device. For example, the flowchart 400 may illustrate programming a first set of memory cells 310 as described with reference to FIG. 3. Other processes illustrated by the flowchart 400 may be described in greater detail in FIGS. 5A and 5B. The processes described with reference to FIG. 4 may allow sense circuitry (e.g., sense circuitry 320 as described with reference to FIG. 3) to accurately sense the logic states stored to the memory cells, which may result in the memory device being properly operated according to the stored data.

At 405, a process (e.g., a fabrication) to program one or more memory cells with one or more operation parameters may be initiated. In some examples, the fabrication process may be performed by a probe or other manufacturing tool and may occur before or after the memory cells are packaged (e.g., packaged into a memory chip or memory device). In some cases, the fabrication process may be performed at least in part using components of the memory device. The fabrication process may be performed on memory cells of a dedicated array (e.g., a dedicated array for storing data for operating a memory device) or may be performed on a subset of memory cells of a main memory array. As described herein, having a dedicated array for storing operational data may simplify some circuitry associated with the memory device due to the dedicated array not using bipolar decoding. Some of the fabrication processes described herein may be performed pre-packaging, while other processes may be performed post-packaging. The manufacturing process may allow sense circuitry to accurately sense the logic states stored to the memory cells, which may result in the memory device being properly operated according to the stored data.

At 410, logic associated with the probe or other manufacturing tool may identify a first quantity of memory cells for programming to a first logic state and identify a second quantity of memory cells for storing a second logic state associated with unprogrammed memory cells. As described herein, a programming pulse may be applied to program respective memory cells to a first logic state, and memory cells that store a second logic state may be left in an unprogrammed state. Accordingly, power may be expended when programming memory cells that store a first logic state and thus (to save power) it may be desirable for a greater quantity of memory cells to be left in the unprogrammed state (e.g., for the second quantity of memory cells to exceed the first quantity of memory cells).

At 415, logic associated with the probe or other manufacturing tool may reverse a pattern for programming the memory cells based on the identified first quantity of memory cells and the second quantity of memory cells. As described herein, it may be desirable for a greater quantity of memory cells to be left in the unprogrammed state. Accordingly, when a greater quantity of memory cells are to be programmed than left unprogrammed, the logic may reverse the programming pattern. When the programming pattern is reversed, memory cells that were to be programmed may be left unprogrammed, and memory cells that were to be left unprogrammed are programmed. Accordingly, the quantity of memory cells left in an unprogrammed state may exceed the quantity of programmed memory cells, which may result in an overall power savings. Regardless if the programming pattern is reversed, the pattern may be stored to the memory device (e.g., to the sense circuitry 320 or the controller 325 as described with reference to FIG. 3) so that the memory device may be operated according to the stored pattern.

At 420, the probe or other manufacturing tool may apply a programming pulse to some memory cells, resulting in the memory cells storing a first logic state. At 420 the memory cells may be programmed for a first time (e.g., the memory cells may be first fired), thus resulting in the memory cells having a relatively low threshold voltage. For example, the memory cells programmed to store the first logic state for a first time may have a higher threshold voltage than memory cells programmed to store the first logic state for an Nth time (e.g., where N is an integer greater than 1). The memory cells programmed to store the first logic state for the first time (and memory cells programmed to store the first logic state for an Nth time) may have a relatively lower threshold voltage than memory cells programmed to store a second logic state (e.g., a different logic state than the first logic state).

At 425, the probe or other manufacturing tool may refrain from applying a programming pulse to some memory cells, resulting in the memory cells storing a second logic state. The unprogrammed memory cells may not have been programmed before, thus resulting in the memory cells having a relatively high threshold voltage. For example, the unprogrammed memory cells may have a higher threshold voltage than if the memory cells were programmed to store the second logic state (e.g., programmed to store the second logic state after being programmed to store the first logic state). The unprogrammed memory cells may thus have a higher threshold voltage than memory cells that are programmed to store the second logic state for an Nth time (e.g., where N is an integer greater than 0). Due to the memory cells programmed to the first logic state having a relatively low threshold voltage and the unprogrammed memory cells having a relatively high threshold voltage, the read window may of the storage element of the memory cells may be relatively large.

At 430, sense circuitry or other logic may identify memory cells programmed to store the first logic state. The operations that occur at 430 may occur post-packaging, thus the memory cells may have undergone a soldering process. In some examples, some redundancy may be employed to ensure that the memory device is operated correctly based on the stored data. That is, redundancy may be employed to ensure that the data stored to the memory array is correctly and accurately sensed. Accordingly, in some instances, multiple memory cells may represent a single bit of data. For example, five (5) to fifty (50) memory cells (or any other quantity or range of memory cells) may represent a single bit of data. The sense circuitry or other logic may identify such redundant memory cells that are programmed to store the first logic state.

In some instances, one or more of the redundant memory cells may have experienced a drift in its threshold voltage. If the shifting or drifting is too large, the data may become corrupted and some memory cells may indicate that they store logic states different than their intended logic states. Accordingly, the specific memory cell (or all of the redundant cells) may be programmed (e.g., reprogrammed to the first logic state) to reset the respective threshold voltage. For example, the soldering process may result in an increase of the threshold voltage of the redundant memory cells. The threshold voltage may increase (e.g., drift) toward the threshold voltage of the unprogrammed memory cells, thus shrinking the read window. Accordingly, such memory cells may be programmed (e.g., re-programmed) to reduce the voltage distribution and widen the read window.

At 435, memory device may apply (e.g., re-apply) the programming pulse to the redundant memory cells storing the first logic state. As described herein, the programming pulse may be reapplied to reduce the voltage distribution of the memory cells and widen the read window. In some instances, the programming pulse may be reapplied to all of the redundant memory cells that store the first logic state, or to the redundant memory cells that store the first logic state and have experienced a drift in threshold voltage.

At 440, sense circuitry or other logic may determine a pattern of logic states stored to the memory array. The pattern may set one or more operational parameters of the memory device, such as redundancy information (e.g., information indicative of defective components within the memory device) and trimming information (e.g., information regarding device specific adjustments to internal characteristics and operating parameters of the memory device), among other information. For redundancy purposes, the sense circuitry or other logic may utilize a differential readout operation that reads out two complementary patterns of data from the programmed array to ensure that the memory device is operated properly. In other instances, the sense circuitry or other logic may read multiple memory cells (e.g., 5 to 50 memory cells) as a single bit of data to ensure that the memory device is operated properly. Accordingly, at 445 the memory device may be operated according to the pattern of data.

Figure 5A:
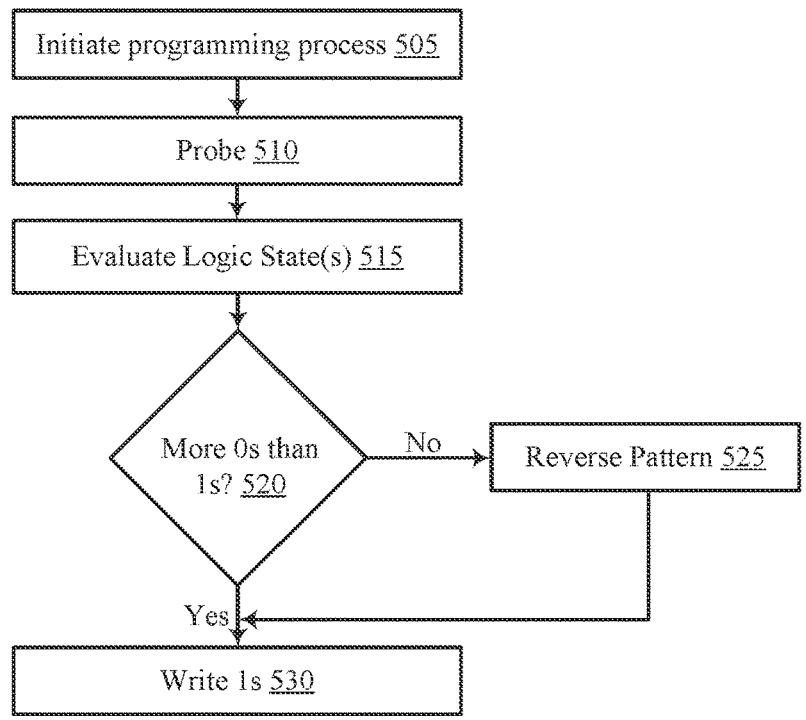
FIGS. 5A and 5B illustrate example flowcharts that support memory cells for storing operational data in accordance with examples as disclosed herein.

FIG. 5A illustrates an example of a flowchart 500-a that supports memory cells for storing operational data in accordance with examples as disclosed herein. In some examples, the flowchart 500-a may illustrate one or more portions for programming memory cells to store operational data as described with reference to FIG. 4. For example, the flowchart 500-a may illustrate operations relating to identifying memory cells for programming (e.g., operation 410 as described with reference to FIG. 4) and reversing a programming pattern (e.g., operation 415 as described with reference to FIG. 4). The processes described with reference to FIG. 5A may result in a power savings during a fabrication process due to a lesser quantity of memory cells being programmed than the memory cells left in an unprogrammed state.

At 505, a process to program one or more memory cells to store one or more operation parameters may be initiated. The process beginning at 505 may be an example of identifying memory cells for programming (e.g., operation 410 as described with reference to FIG. 4) and reversing a programming pattern (e.g., operation 415 as described with reference to FIG. 4). As described herein, the process may result in a power savings during a fabrication process due to a lesser quantity of memory cells being programmed than the memory cells left in an unprogrammed state.

At 510, a probe or other manufacturing tool may be activated to perform the operations illustrated by FIG. 5A. The probe or other manufacturing tool may perform the process on memory cells of a dedicated array (e.g., a dedicated array for storing data for operating a memory device) or may be performed on a subset of memory cells of a main memory array. The fabrication processes performed by the probe and illustrated in FIG. 5A may be performed pre-packaging, although other processes described herein may be performed post-packaging. The manufacturing process may allow sense circuitry to accurately sense the logic states stored to the memory cells, which may result in the memory device being properly operated according to the stored data.

At 515, the probe (or logic associated with the probe or other manufacturing tool) and/or logic associated with the memory device may identify a first quantity of memory cells for programming to a first logic state (FL1) and identify a second quantity of memory cells for programming to a second logic state (FL0). As described herein, a programming pulse may be applied to program respective memory cells to a first logic state, and memory cells that store a second logic state may be left in an unprogrammed state. Accordingly, power may be expended when programming memory cells that store a first logic state and thus (to save power) it may be desirable for a greater quantity of memory cells to be left in the unprogrammed state (e.g., for FL0≥FL1).

At 520, the probe (or logic associated with the probe or other manufacturing tool) and/or logic associated with the memory device may determine whether the quantity of memory cells to be left in the unprogrammed state exceeds the quantity of memory cells to be programmed to store the first logic state (e.g., whether FL0≥FL1). If FL0≥FL1 then the programming pattern may not be reversed. However, if FL0<FL1 then the programming pattern may be reversed to save power.

At 525, if the quantity of memory cells to be left in the unprogrammed state is not greater than or equal to the quantity of memory cells to be programmed to the first logic state, the probe (or logic associated with the probe or other manufacturing tool) and/or logic associated with the memory device may reverse the programming pattern. As described herein, it may be desirable for a greater quantity of memory cells to be left in the unprogrammed state. Accordingly, when a greater quantity of memory cells are to be programmed than left unprogrammed, the logic may reverse the programming pattern. When the programming pattern is reversed, memory cells that were to be programmed may be left unprogrammed, and memory cells that were to be left unprogrammed are programmed. Accordingly, the quantity of memory cells left in an unprogrammed state may exceed the quantity of programmed memory cells, which may result in an overall power savings.

At 530, the probe or other manufacturing tool and/or logic associated with the memory device may apply a programming pulse to some memory cells to write a first logic state (e.g., to write logic "1s"). The probe or other manufacturing tool may apply the programming pulse according to the original pattern (e.g., if FL0≥FL1) or the reversed pattern (e.g., if FL0<FL1). The programming pulse may result in the memory cells being programmed for a first time, thus resulting in the memory cells having a relatively low threshold voltage. For example, the memory cells that are programmed to store the first logic state for a first time may have a higher threshold voltage than memory cells programmed to store the first logic state for an Nth time (e.g., where N is an integer greater than 1). The memory cells programmed to store the first logic state for the first time (and memory cells programmed to store the first logic state for an Nth time) may have a relatively lower threshold voltage than memory cells programmed to store a second logic state (e.g., a different logic state than the first logic state).

Figure 5B:
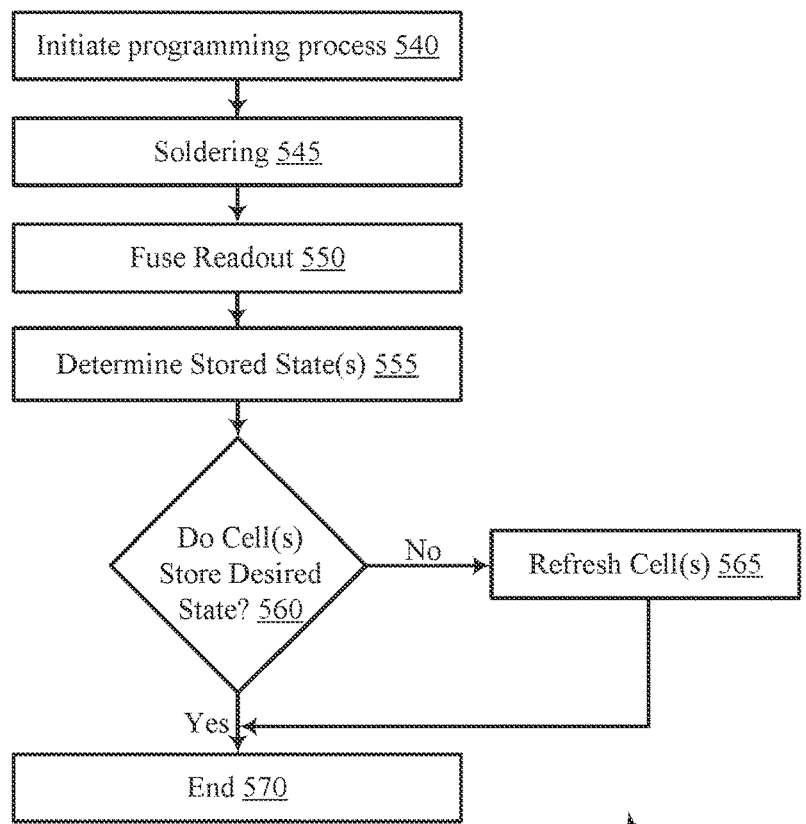

FIG. 5B illustrates an example of a flowchart 500-b that supports memory cells for storing operational data in accordance with examples as disclosed herein. In some examples, the flowchart 500-b may illustrate one or more portions for programming memory cells to store operational data as described with reference to FIG. 4. For example, the flowchart 500-b may illustrate operations relating to identifying memory cells programmed to the first logic state (e.g., operation 430 as described with reference to FIG. 4) and re-applying a programming pulse to the identified memory cells (e.g., operation 435 as described with reference to FIG. 4). The processes described with reference to FIG. 5B may be performed for redundancy purposes to accurately sense the logic states stored to the memory cells, which may result in the memory device being properly operated according to the stored data.

At 540, a process to program one or more memory cells to store one or more operation parameters may be initiated. The process may also entail identifying memory cells programmed to the first logic state and re-applying a programming pulse to the identified memory cells. Thus, FIG. 5B may illustrate steps that occur during and post-packaging.

At 545, a probe or other manufacturing tool may solder a memory array to a memory device. As described herein, the array may be a dedicated array for storing operational data or may be a main memory array (e.g., the operational data may be stored to a portion of the main array). The soldering process may occur at a relatively high temperature (e.g., 250 C) for a relatively long duration (e.g., 30 minutes). The soldering process thus may result in some memory cells experiencing a voltage drift. Accordingly, one or more subsequent processes described with reference to FIG. 5B may mitigate any problems that would otherwise arise due to the voltage drift.

At 550, sense circuitry (e.g., sense circuitry 320 as described with reference to FIG. 3) or other logic may perform a readout on the memory cells that store operational data. As described herein, some redundancy may be employed to ensure that the memory device is operated correctly based on the stored data. That is, redundancy may be employed to ensure that the data stored to the memory array is correctly and accurately sensed. Accordingly, in some instances, multiple memory cells (e.g., a subset of memory cells) may represent a single bit of data. For example, five (5) to fifty (50) memory cells (or any other quantity or range of memory cells) may represent a single bit of data. The sense circuitry or other logic may readout the values of memory cell of the (redundant) subset.

At 555, the sense circuitry or other logic may determine a logic state stored to the redundant memory cells based on the readout (e.g., at 550). In some examples, the logic states may be based on a threshold voltage of each memory cell, which may have drifted during the soldering operation. Accordingly, although each of the memory cells was initially programmed to a first logic state, the drifted threshold voltage may result in the logic state resembling an intermediate logic state (e.g., a logic state between the first logic state and the second logic state; a third logic state) or the second logic state. Such memory cells may be programmed (e.g., reprogramed) to store the first logic state.

At 560, the sense circuitry or other logic may determine whether each of the redundant memory cells store the desired logic state (e.g., the logic state stored by the cells before the soldering process at 545). If the memory cells each store the first logic state, the flow may progress to 570 and the operations relating to identifying memory cells programmed to the first logic state and re-applying a programming pulse to the identified memory cells may be complete.

At 565, the memory device may refresh some or all of the memory cells that store the first logic state (e.g., memory cells that have been programmed or first fired). The memory device may refresh the memory cells by applying (e.g., reapplying) the programming pulse to the memory cells in order to program (e.g., reprogram) the first logic state to the respective memory cells. In some examples, a memory controller (e.g., the controller 325 as described with reference to FIG. 3) or other component of the memory device may initiate the application of the programming pulse. Refreshing the memory cells that experienced a drift in threshold voltage may result in each of the redundant memory cells storing the first logic state (and not an intermediate logic state), which may in the data stored to the memory array being accurately sensed and, in turn, the memory device being operated as intended. The unprogrammed memory cells may not be refreshed because refreshing the cells may alter the threshold voltage of the cells and may introduce errors into the stored information.

At 570 the operations relating to identifying memory cells programmed to the first logic state and re-applying a programming pulse to the identified memory cells may be complete.

Figure 6:
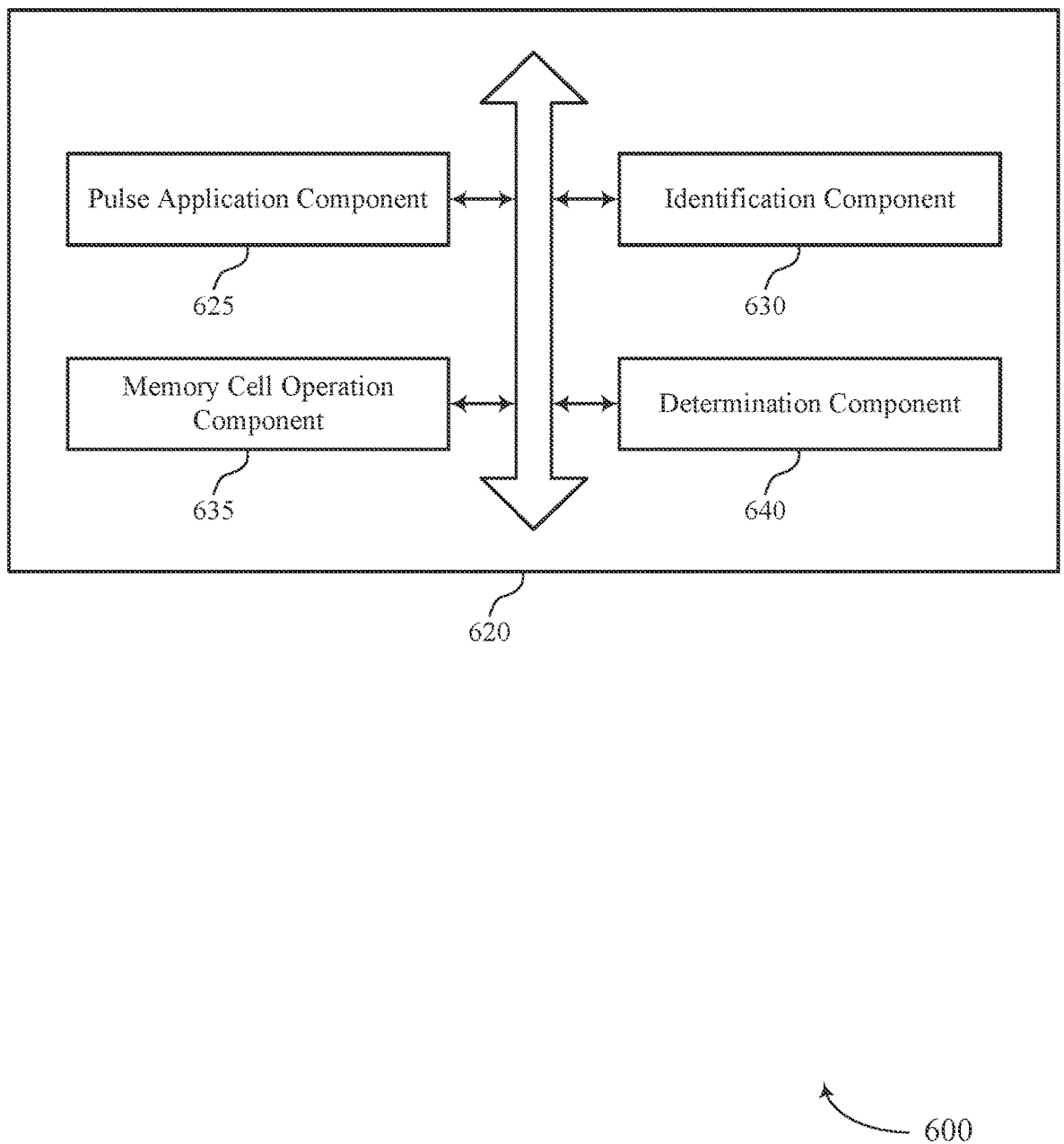
FIG. 6 shows a block diagram of a controller that supports memory cells for storing operational data in accordance with examples as disclosed herein.

FIG. 6 shows a block diagram 600 of a controller 620 that supports memory cells for storing operational data in accordance with examples as disclosed herein. The controller 620 may be an example of aspects of a controller as described with reference to FIGS. 1 through 6. The controller 620, or various components thereof, may be an example of means for performing various aspects of memory cells for storing operational data as described herein. In some examples, the controller may be associated with a memory device (e.g., a memory device 305 as described with reference to FIG. 3) or may be associated with manufacturing equipment (e.g., equipment for manufacturing a memory device). The controller 620 may include a pulse application component 625, an identification component 630, a memory cell operation component 635, a determination component 640, or any combination thereof. Each of these components may communicate, directly or indirectly, with one another (e.g., via one or more buses).

The pulse application component 625 may be configured as or otherwise support a means for applying a programming pulse to program a first memory cell of a first set of memory cells of a memory device to a first logic state, where the memory device includes a second set of memory cells for storing host data and the first set of memory cells for storing data associated with operating the memory device.

In some examples, the pulse application component 625 may be configured as or otherwise support a means for applying the programming pulse to program the first subset of the first set of memory cells to the first logic state based at least in part on the first quantity of memory cells in the first subset satisfying a threshold.

In some examples, the pulse application component 625 may be configured as or otherwise support a means for applying the programming pulse to program the second subset of the first set of memory cells to the first logic state based at least in part on the second quantity of memory cells being less than the first quantity of memory cells.

In some examples, the pulse application component 625 may be configured as or otherwise support a means for applying a second programming pulse to program the second quantity of memory cells of the first set of memory cells to the first logic state that is associated with the first threshold voltage based at least in part on the second quantity of memory cells being programmed to store the first logic state that is associated with the second threshold voltage.

In some examples, the pulse application component 625 may be configured as or otherwise support a means for maintaining the second memory cell of the first set of memory cells in the second logic state based at least in part on applying the programming pulse to program the first memory cell of the first set of memory cells, where identifying that the second memory cell stores the second logic state is based at least in part on maintaining the second memory cell in the second logic state.

In some examples, to support maintaining the second memory cell of the first set of memory cells in the second logic state, the pulse application component 625 may be configured as or otherwise support a means for refraining from applying the programming pulse to program the second memory cell of the first set of memory cells of the memory device to the first logic state.

In some examples, the identification component 630 may be configured as or otherwise support a means for identifying that the first memory cell of the first set of memory cells stores the first logic state associated with a programmed memory cell based at least in part on applying the programming pulse to program the first memory cell to the first logic state, where operating the second set of memory cells to store the host data is based at least in part on identifying that the first memory cell stores the first logic state.

In some examples, the identification component 630 may be configured as or otherwise support a means for identifying a first subset of the first set of memory cells for programming with the programming pulse.

The identification component 630 may be configured as or otherwise support a means for identifying that a second memory cell of the first set of memory cells stores a second logic state associated with an unprogrammed memory cell based at least in part on applying the programming pulse to program the first memory cell to the first logic state.

In some examples, the identification component 630 may be configured as or otherwise support a means for identifying a second subset of the first set of memory cells to store the second logic state associated with the unprogrammed memory cell based at least in part on identifying the first subset of the first set of memory cells for programming.

In some examples, the identification component 630 may be configured as or otherwise support a means for identifying a first quantity of memory cells of the first set of memory cells that are programmed to store the first logic state that is associated with a first threshold voltage.

In some examples, the identification component 630 may be configured as or otherwise support a means for identifying a second quantity of memory cells of the first set of memory cells that are programmed to store the first logic state that is associated with a second threshold voltage that is different than the first threshold voltage, where the first set of memory cells represents a single bit of data associated with the first logic state.

The memory cell operation component 635 may be configured as or otherwise support a means for operating the second set of memory cells to store the host data based at least in part on identifying that the second memory cell stores the second logic state.

In some examples, the determination component 640 may be configured as or otherwise support a means for determining a first quantity of memory cells in the first subset of the first set of memory cells based at least in part on identifying the first subset of the first set of memory cells for programming.

In some examples, the determination component 640 may be configured as or otherwise support a means for determining that a second quantity of memory cells in the second subset of the first set of memory cells exceeds the first quantity of memory cells in the first subset of the first set of memory cells based at least in part on identifying the second subset of the first set of memory cells, where applying the programming pulse to program the first subset of the first set of memory cells to the first logic state is based at least in part on the second quantity of memory cells exceeding the first quantity of memory cells.

In some examples, the determination component 640 may be configured as or otherwise support a means for determining that a second quantity of memory cells in a second subset of the first set of memory cells is less than the first quantity of memory cells in the first subset of the first set of memory cells based at least in part on identifying the first subset of the first set of memory cells for programming.

Figure 7:
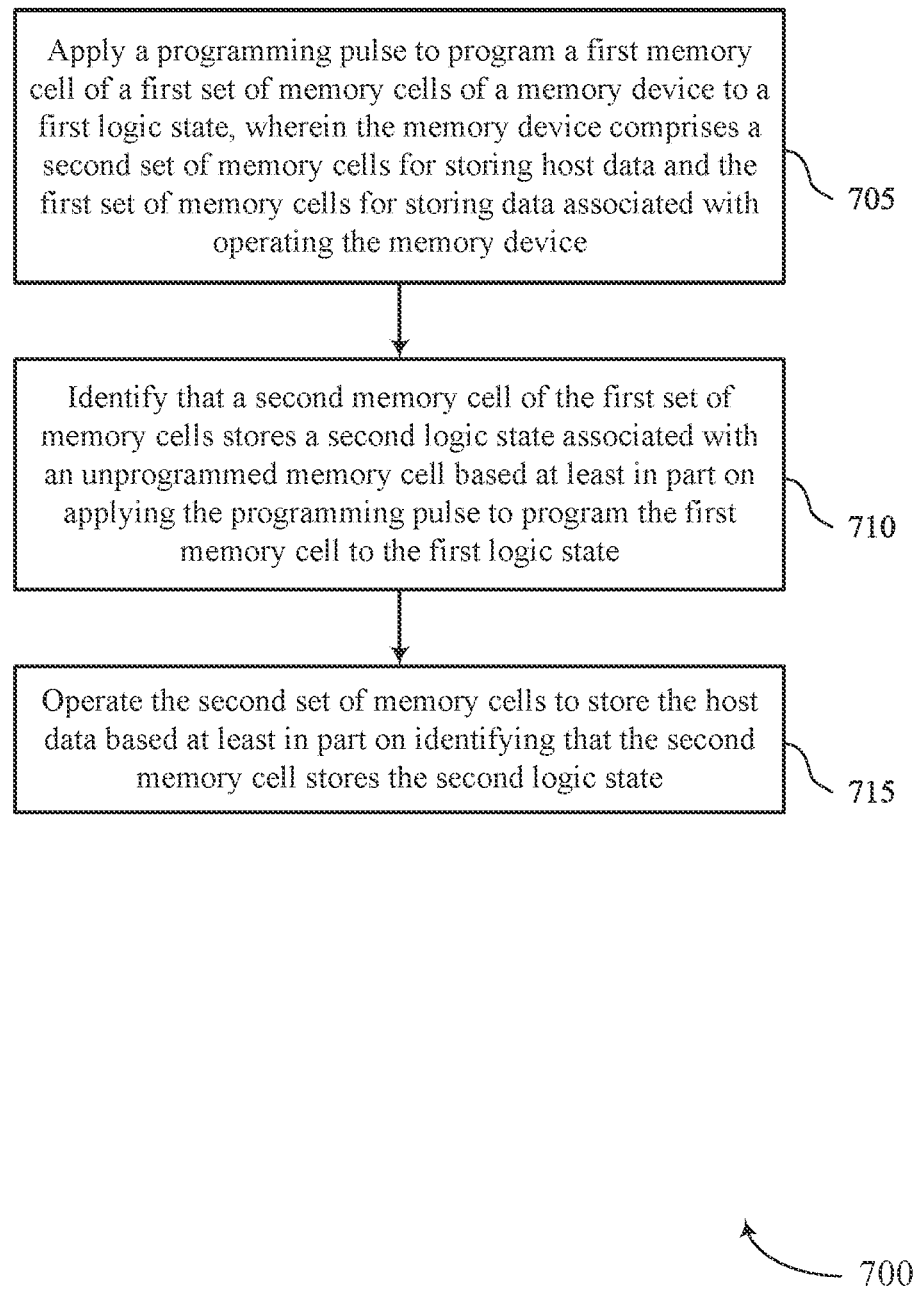
FIG. 7 shows a flowchart illustrating a method or methods that support memory cells for storing operational data in accordance with examples as disclosed herein.

FIG. 7 shows a flowchart illustrating a method 700 that supports memory cells for storing operational data in accordance with examples as disclosed herein. The operations of method 700 may be implemented by a controller or its components as described herein. For example, the operations of method 700 may be performed by a controller as described with reference to FIGS. 1, 3, and 5. In some examples, the controller may be associated with a memory device (e.g., a memory device 305 as described with reference to FIG. 3) or may be associated with manufacturing equipment (e.g., equipment for manufacturing a memory device). The controller may execute a set of instructions to control the functional elements of the device to perform the described functions. Additionally or alternatively, the controller may perform aspects of the described functions using special-purpose hardware.

At 705, the method may include applying a programming pulse to program a first memory cell of a first set of memory cells of a memory device to a first logic state, where the memory device includes a second set of memory cells for storing host data and the first set of memory cells for storing data associated with operating the memory device. The operations of 705 may be performed in accordance with examples as disclosed herein. In some examples, aspects of the operations of 705 may be performed by a pulse application component 625 as described with reference to FIG. 6.

At 710, the method may include identifying that a second memory cell of the first set of memory cells stores a second logic state associated with an unprogrammed memory cell based at least in part on applying the programming pulse to program the first memory cell to the first logic state. The operations of 710 may be performed in accordance with examples as disclosed herein. In some examples, aspects of the operations of 710 may be performed by an identification component 630 as described with reference to FIG. 6.

At 715, the method may include operating the second set of memory cells to store the host data based at least in part on identifying that the second memory cell stores the second logic state. The operations of 715 may be performed in accordance with examples as disclosed herein. In some examples, aspects of the operations of 715 may be performed by a memory cell operation component 635 as described with reference to FIG. 6.

In some examples, an apparatus as described herein may perform a method or methods, such as the method 700. The apparatus may include, features, circuitry, logic, means, or instructions (e.g., a non-transitory computer-readable medium storing instructions executable by a processor) for applying a programming pulse to program a first memory cell of a first set of memory cells of a memory device to a first logic state, where the memory device includes a second set of memory cells for storing host data and the first set of memory cells for storing data associated with operating the memory device, identifying that a second memory cell of the first set of memory cells stores a second logic state associated with an unprogrammed memory cell based at least in part on applying the programming pulse to program the first memory cell to the first logic state, and operating the second set of memory cells to store the host data based at least in part on identifying that the second memory cell stores the second logic state.

Some examples of the method 700 and the apparatus described herein may further include operations, features, circuitry, logic, means, or instructions for identifying that the first memory cell of the first set of memory cells stores the first logic state associated with a programmed memory cell based at least in part on applying the programming pulse to program the first memory cell to the first logic state, where operating the second set of memory cells to store the host data may be based at least in part on identifying that the first memory cell stores the first logic state.

Some examples of the method 700 and the apparatus described herein may further include operations, features, circuitry, logic, means, or instructions for identifying a first subset of the first set of memory cells for programming with the programming pulse, determining a first quantity of memory cells in the first subset of the first set of memory cells based at least in part on identifying the first subset of the first set of memory cells for programming, and applying the programming pulse to program the first subset of the first set of memory cells to the first logic state based at least in part on the first quantity of memory cells in the first subset satisfying a threshold.

Some examples of the method 700 and the apparatus described herein may further include operations, features, circuitry, logic, means, or instructions for identifying a second subset of the first set of memory cells to store the second logic state associated with the unprogrammed memory cell based at least in part on identifying the first subset of the first set of memory cells for programming and determining that a second quantity of memory cells in the second subset of the first set of memory cells exceeds the first quantity of memory cells in the first subset of the first set of memory cells based at least in part on identifying the second subset of the first set of memory cells, where applying the programming pulse to program the first subset of the first set of memory cells to the first logic state may be based at least in part on the second quantity of memory cells exceeding the first quantity of memory cells.

Some examples of the method 700 and the apparatus described herein may further include operations, features, circuitry, logic, means, or instructions for determining that a second quantity of memory cells in a second subset of the first set of memory cells may be less than the first quantity of memory cells in the first subset of the first set of memory cells based at least in part on identifying the first subset of the first set of memory cells for programming and applying the programming pulse to program the second subset of the first set of memory cells to the first logic state based at least in part on the second quantity of memory cells being less than the first quantity of memory cells.

Some examples of the method 700 and the apparatus described herein may further include operations, features, circuitry, logic, means, or instructions for identifying a first quantity of memory cells of the first set of memory cells that may be programmed to store the first logic state that may be associated with a first threshold voltage and identifying a second quantity of memory cells of the first set of memory cells that may be programmed to store the first logic state that may be associated with a second threshold voltage that may be different than the first threshold voltage, where the first set of memory cells represents a single bit of data associated with the first logic state.

Some examples of the method 700 and the apparatus described herein may further include operations, features, circuitry, logic, means, or instructions for applying a second programming pulse to program the second quantity of memory cells of the first set of memory cells to the first logic state that may be associated with the first threshold voltage based at least in part on the second quantity of memory cells being programmed to store the first logic state that may be associated with the second threshold voltage.

Some examples of the method 700 and the apparatus described herein may further include operations, features, circuitry, logic, means, or instructions for maintaining the second memory cell of the first set of memory cells in the second logic state based at least in part on applying the programming pulse to program the first memory cell of the first set of memory cells, where identifying that the second memory cell stores the second logic state may be based at least in part on maintaining the second memory cell in the second logic state.

In some examples of the method 700 and the apparatus described herein, maintaining the second memory cell of the first set of memory cells in the second logic state may include operations, features, circuitry, logic, means, or instructions for refraining from applying the programming pulse to program the second memory cell of the first set of memory cells of the memory device to the first logic state.

It should be noted that the methods described herein describe possible implementations, and that the operations and the steps may be rearranged or otherwise modified and that other implementations are possible. Furthermore, portions from two or more of the methods may be combined.

An apparatus is described. The apparatus may include a first set of memory cells each including a chalcogenide element and configured for storing data associated with operating a second set of memory cells, where a first memory cell of the first set of memory cells includes a programmed memory cell that is written to a first logic state, and where a second memory cell of the first set of memory cells includes an unprogrammed memory cell that stores a second logic state, the second set of memory cells for storing host data, sense circuit coupled with the first set of memory cells and configured to identify respective logic states stored by the first memory cell and the second memory cell, and a controller coupled with the first set of memory cells, the second set of memory cells, and the sense circuit and configured to access the second set of memory cells based at least in part on the respective logic states stored by the first memory cell and the second memory cell In some examples of the apparatus, a first subset of the first set of memory cells including programmed memory cells that may be written to the first logic state, where the first subset of the first set of memory cells written to the first logic state represent a single bit of data associated with operating the second set of memory cells.

In some examples of the apparatus, the first subset of the first set of memory cells include a higher threshold voltage than a second programmed memory cell that may be written to the first logic state.

In some examples of the apparatus, a first subset of memory cells of the first set of memory cells including programmed memory cells that may be written to the first logic state and a second subset of memory cells of the first set of memory cells including unprogrammed memory cells that store the second logic state.

In some examples of the apparatus, the controller may be configured to access the second set of memory cells based at least in part on a pattern of the first subset of memory cells written to the first logic state and the second subset of memory cells that store the second logic state.

In some examples of the apparatus, the first memory cell of the first set of memory cells may be programmed to the first logic state a single time and the second memory cell of the first set of memory cells may have never been programmed to any logic state.

In some examples of the apparatus, the first memory cell of the first set of memory cells may be configured to be programmed to the first logic state that may be associated with a first threshold voltage or to the first logic state that may be associated with a second threshold voltage that may be different than the first threshold voltage.

In some examples of the apparatus, a first array of memory cells includes the first set of memory cells and may be separate from a second array of memory cells that includes the second set of memory cells.

In some examples of the apparatus, a first portion of the data associated with operating the second set of memory cells may be stored in the first array of memory cells and a second portion of the data associated with operating the second set of memory cells may be stored in the second array of memory cells.

In some examples of the apparatus, the host data includes information received from a host device for storing in the second set of memory cells.

In some examples of the apparatus, the first memory cell of the first set of memory cells includes a lower threshold voltage than the second memory cell of the first set of memory cells.

In some examples of the apparatus, the programmed first memory cell of the first set of memory cells may be associated with a first threshold voltage, and a second programmed memory cell of the first set of memory cells may be associated with a second threshold voltage that may be based at least in part on the first threshold voltage drifting to the second threshold voltage.

Another apparatus is described. The apparatus may include a first set of memory cells each including a chalcogenide element and configured for storing data associated with operating a second set of memory cells, the second set of memory cells, a controller coupled with the first set of memory cells, the second set of memory cells, where the controller is configured to, apply a programming pulse to program a first memory cell of the first set of memory cells to a first logic state, identify that a second memory cell of the first set of memory cells stores a second logic state associated with an unprogrammed memory cell based at least in part on applying the programming pulse to program the first memory cell to the first logic state, and operate the second set of memory cells to store host data based at least in part on identifying that the second memory cell stores the second logic state In some examples of the apparatus, the controller may be configured to maintain the second memory cell of the first set of memory cells in the second logic state by refraining from applying the programming pulse to program the second memory cell of the first set of memory cells to the first logic state.

In some examples of the apparatus, the controller may be configured to identify a first subset of the first set of memory cells for programming with the programming pulse, identify a second subset of the first set of memory cells to store the second logic state associated with the unprogrammed memory cell based at least in part on identifying the first subset of the first set of memory cells, determine that a first quantity of memory cells in the second subset of the first set of memory cells exceeds a second quantity of memory cells in the first subset of the first set of memory cells based at least in part on identifying the second subset of the first set of memory cells, and apply the programming pulse to program the first subset of the first set of memory cells to the first logic state based at least in part on the first quantity of memory cells exceeding the second quantity of memory cells.

In some examples of the apparatus, the controller may be configured to apply the programming pulse to program the second subset of the first set of memory cells to the first logic state based at least in part on the first quantity of memory cells being less than the second quantity of memory cells.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a first set of memory cells each comprising a chalcogenide element and configured for storing data associated with operating a second set of memory cells, wherein a first memory cell of the first set of memory cells comprises a programmed memory cell that is written to a first logic state, and wherein a second memory cell of the first set of memory cells comprises an unprogrammed memory cell that stores a second logic state;
the second set of memory cells for storing host data;
a sense circuit coupled with the first set of memory cells and configured to identify respective logic states stored by the first memory cell and the second memory cell; and
a controller coupled with the first set of memory cells, the second set of memory cells, and the sense circuit and configured to access the second set of memory cells based at least in part on the respective logic states stored by the first memory cell and the second memory cell.

2. The apparatus of claim 1, further comprising:
a first subset of the first set of memory cells comprising programmed memory cells that are written to the first logic state, wherein the first subset of the first set of memory cells written to the first logic state represent a single bit of data associated with operating the second set of memory cells.

3. The apparatus of claim 2, wherein the first subset of the first set of memory cells comprise a higher threshold voltage than a second programmed memory cell that is written to the first logic state.

4. The apparatus of claim 1, further comprising:
a first subset of memory cells of the first set of memory cells comprising programmed memory cells that are written to the first logic state; and
a second subset of memory cells of the first set of memory cells comprising unprogrammed memory cells that store the second logic state.

5. The apparatus of claim 4, wherein the controller is configured to access the second set of memory cells based at least in part on a pattern of the first subset of memory cells written to the first logic state and the second subset of memory cells that store the second logic state.

6. The apparatus of claim 1, wherein:
the first memory cell of the first set of memory cells is programmed to the first logic state a single time; and
the second memory cell of the first set of memory cells has never been programmed to any logic state.

7. The apparatus of claim 1, wherein the first memory cell of the first set of memory cells is configured to be programmed to the first logic state that is associated with a first threshold voltage or to the first logic state that is associated with a second threshold voltage that is different than the first threshold voltage.

8. The apparatus of claim 1, wherein a first array of memory cells comprises the first set of memory cells and is separate from a second array of memory cells that comprises the second set of memory cells.

9. The apparatus of claim 8, wherein:
a first portion of the data associated with operating the second set of memory cells is stored in the first array of memory cells; and
a second portion of the data associated with operating the second set of memory cells is stored in the second array of memory cells.

10. The apparatus of claim 1, wherein the host data comprises information received from a host device for storing in the second set of memory cells.

11. The apparatus of claim 1, wherein the first memory cell of the first set of memory cells comprises a lower threshold voltage than the second memory cell of the first set of memory cells.

12. The apparatus of claim 1, wherein:
the programmed first memory cell of the first set of memory cells is associated with a first threshold voltage, and
a second programmed memory cell of the first set of memory cells is associated with a second threshold voltage that is based at least in part on the first threshold voltage drifting to the second threshold voltage.

13. A method, comprising:
applying a programming pulse to program a first memory cell of a first set of memory cells of a memory device to a first logic state, wherein the memory device comprises a second set of memory cells for storing host data and the first set of memory cells for storing data associated with operating the memory device;
identifying that a second memory cell of the first set of memory cells stores a second logic state associated with an unprogrammed memory cell based at least in part on applying the programming pulse to program the first memory cell to the first logic state; and
operating the second set of memory cells to store the host data based at least in part on identifying that the second memory cell stores the second logic state.

14. The method of claim 13, further comprising:
identifying that the first memory cell of the first set of memory cells stores the first logic state associated with a programmed memory cell based at least in part on applying the programming pulse to program the first memory cell to the first logic state, wherein operating the second set of memory cells to store the host data is based at least in part on identifying that the first memory cell stores the first logic state.

15. The method of claim 13, further comprising:
identifying a first subset of the first set of memory cells for programming with the programming pulse;
determining a first quantity of memory cells in the first subset of the first set of memory cells based at least in part on identifying the first subset of the first set of memory cells for programming; and
applying the programming pulse to program the first subset of the first set of memory cells to the first logic state based at least in part on the first quantity of memory cells in the first subset satisfying a threshold.

16. The method of claim 15, further comprising:
identifying a second subset of the first set of memory cells to store the second logic state associated with the unprogrammed memory cell based at least in part on identifying the first subset of the first set of memory cells for programming; and
determining that a second quantity of memory cells in the second subset of the first set of memory cells exceeds the first quantity of memory cells in the first subset of the first set of memory cells based at least in part on identifying the second subset of the first set of memory cells, wherein applying the programming pulse to program the first subset of the first set of memory cells to the first logic state is based at least in part on the second quantity of memory cells exceeding the first quantity of memory cells.

17. The method of claim 15, further comprising:
determining that a second quantity of memory cells in a second subset of the first set of memory cells is less than the first quantity of memory cells in the first subset of the first set of memory cells based at least in part on identifying the first subset of the first set of memory cells for programming; and
applying the programming pulse to program the second subset of the first set of memory cells to the first logic state based at least in part on the second quantity of memory cells being less than the first quantity of memory cells.

18. The method of claim 13, further comprising:
identifying a first quantity of memory cells of the first set of memory cells that are programmed to store the first logic state that is associated with a first threshold voltage; and
identifying a second quantity of memory cells of the first set of memory cells that are programmed to store the first logic state that is associated with a second threshold voltage that is different than the first threshold voltage, wherein the first set of memory cells represents a single bit of data associated with the first logic state.

19. The method of claim 18, further comprising:
applying a second programming pulse to program the second quantity of memory cells of the first set of memory cells to the first logic state that is associated with the first threshold voltage based at least in part on the second quantity of memory cells being programmed to store the first logic state that is associated with the second threshold voltage.

20. The method of claim 13, further comprising:
maintaining the second memory cell of the first set of memory cells in the second logic state based at least in part on applying the programming pulse to program the first memory cell of the first set of memory cells, wherein identifying that the second memory cell stores the second logic state is based at least in part on maintaining the second memory cell in the second logic state.

21. The method of claim 20, wherein maintaining the second memory cell of the first set of memory cells in the second logic state comprises:
refraining from applying the programming pulse to program the second memory cell of the first set of memory cells of the memory device to the first logic state.

22. An apparatus, comprising:
a first set of memory cells each comprising a chalcogenide element and configured for storing data associated with operating a second set of memory cells;
the second set of memory cells; and
a controller coupled with the first set of memory cells, the second set of memory cells, wherein the controller is configured to:
apply a programming pulse to program a first memory cell of the first set of memory cells to a first logic state;
identify that a second memory cell of the first set of memory cells stores a second logic state associated with an unprogrammed memory cell based at least in part on applying the programming pulse to program the first memory cell to the first logic state; and
operate the second set of memory cells to store host data based at least in part on identifying that the second memory cell stores the second logic state.

23. The apparatus of claim 22, wherein the controller is configured to:
maintain the second memory cell of the first set of memory cells in the second logic state by refraining from applying the programming pulse to program the second memory cell of the first set of memory cells to the first logic state.

24. The apparatus of claim 22, wherein the controller is configured to:
identify a first subset of the first set of memory cells for programming with the programming pulse;
identify a second subset of the first set of memory cells to store the second logic state associated with the unprogrammed memory cell based at least in part on identifying the first subset of the first set of memory cells;
determine that a first quantity of memory cells in the second subset of the first set of memory cells exceeds a second quantity of memory cells in the first subset of the first set of memory cells based at least in part on identifying the second subset of the first set of memory cells; and
apply the programming pulse to program the first subset of the first set of memory cells to the first logic state based at least in part on the first quantity of memory cells exceeding the second quantity of memory cells.

25. The apparatus of claim 24, wherein the controller is further configured to:
apply the programming pulse to program the second subset of the first set of memory cells to the first logic state based at least in part on the first quantity of memory cells being less than the second quantity of memory cells.

* * * * *